United States Patent
Chang et al.

(10) Patent No.: US 11,211,780 B1
(45) Date of Patent: Dec. 28, 2021

(54) CABLE PASS-THROUGH DEVICE

(71) Applicant: QUANTA COMPUTER INC., Taoyuan (TW)

(72) Inventors: Chun Chang, Taoyuan (TW); Hsin-Chieh Lin, Taoyuan (TW); Yao-Long Lin, Taoyuan (TW); Chih-Wei Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/020,228

(22) Filed: Sep. 14, 2020

(51) Int. Cl.
*H02G 3/22* (2006.01)
*H05K 5/02* (2006.01)

(52) U.S. Cl.
CPC .............. *H02G 3/22* (2013.01); *H05K 5/0247* (2013.01)

(58) Field of Classification Search
CPC .......... H02G 3/088; H02G 3/083; H02G 3/14; H02G 3/22; H02G 3/08; H02G 3/081; H02G 3/24; H05K 5/0247; H05K 5/00; H05K 5/02
USPC ....... 174/50, 53, 57, 58, 650, 480, 481, 502, 174/539, 152 R, 153 G, 152 G, 135, 564; 16/2.1, 2.2; 220/3.2–3.9, 4.02; 361/600, 361/679.02
See application file for complete search history.

(56) References Cited

U.S. PATENT DOCUMENTS

| | | | | |
|---|---|---|---|---|
| 5,783,776 A | * | 7/1998 | Birmingham | F16L 5/08 174/657 |
| 6,046,406 A | * | 4/2000 | Milanowski | H02G 15/013 174/77 R |
| 6,351,592 B1 | * | 2/2002 | Ehn | G02B 6/4452 174/541 |
| 6,867,371 B2 | * | 3/2005 | Daoud | G02B 6/4428 174/652 |
| 7,037,128 B2 | * | 5/2006 | Yaworski | H01R 13/5216 439/276 |
| 7,288,730 B2 | * | 10/2007 | Habel | H02G 3/22 16/2.1 |
| 7,495,171 B2 | * | 2/2009 | Gorin | H02G 3/085 174/66 |
| 8,541,698 B2 | * | 9/2013 | Perschon | H02B 1/50 174/650 |
| 9,249,902 B2 | * | 2/2016 | Munroe | H01R 13/5205 |
| 10,574,048 B2 | * | 2/2020 | Nowastowski-Stock | H02G 3/22 |

* cited by examiner

*Primary Examiner* — Angel R Estrada
(74) *Attorney, Agent, or Firm* — Nixon Peabody LLP (57) ABSTRACT

A pass-through device seals an opening of a barrier while permitting one or more cables to pass through the opening. The pass-through device includes a two-part seal that moves between an open position that permits insertion of a cable, and a closed position that establishes an airtight seal around the cable. The two-part seal can include a stationary seal segment and a moving seal segment. The moving seal segment can be moved away from the stationary seal segment by unlatching and opening a door on the pass-through device. A cable can be placed between the seal segments, and the door can be closed until it latches, thus sealing the cable between the seal segments. The seal segments can include inclines to urge the cable towards cable openings of the seal segments. In some cases, the two-part seal can include openings for multiple cables.

20 Claims, 10 Drawing Sheets

CABLE PASS-THROUGH DEVICE

TECHNICAL FIELD

The present disclosure relates to computer systems generally and more specifically to pass-through devices for computer cables.

BACKGROUND

In many computing environments, especially in large datacenters, there is often a need to pass cables through a barrier or wall. For some barriers, especially the walls of computer chassis, there is often a need to keep the pass-through as sealed as possible, such as to avoid impact to the cooling systems of the chassis and to avoid the ingress of debris and detritus. For example, an unsealed opening in a wall of a computer chassis can reduce cooling efficiency by leaving an unplanned, air-movement path that bypasses various components that may require cooling.

Common techniques for passing cables through walls involve placing the cable through an opening, then filling the opening with foam packing or glue. While these techniques may help seal the opening, they are often difficult and time-consuming to install. Additionally, these techniques can be problematic if the cable needs to be removed or replaced.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a cable pass-through device comprising a main body couplable to a barrier having a barrier opening. The main body has an opening aligned with the barrier opening. The pass-through device further comprises an elastomeric first seal segment coupled to the main body at the opening of the main body, and an elastomeric second seal segment positioned adjacent the first seal segment. The second seal segment is movable between an open position and a closed position. The second seal segment is spaced apart from the first seal segment in the open position and compressed against the first seal segment in the closed position. The first seal segment and the second seal segment are shaped to receive and compress against a cable therebetween when the second seal segment is in the closed position. The pass-through device further comprises a door coupled to the main body and the second seal segment, wherein the door is movable between a door open position and a door closed position. Movement of the door to the door closed position induces the second seal segment to move to the closed position. Movement of the door to the door open position induces the second seal segment to move to the open position. The pass-through device further comprises a latch for securing the door in the door closed position, and an actuator coupled to the latch for releasing the latch.

In some cases, the first seal segment comprises a first cable opening for receiving the cable and the second seal segment comprises a second cable opening for receiving the cable. In some cases, at least one seal segment of the first seal segment and the second seal segment comprises compression grooves. The compression grooves are adjacent the cable opening to facilitate establishing an airtight seal between the seal segment and the cable when the second seal segment is in the closed position. In some cases, the first seal segment comprises a first angled surface for urging the cable towards the first cable opening. In some cases, the second seal segment comprises a second angled surface for urging the cable towards the second cable opening. In some cases, the pass-through device further comprises a door biasing element for biasing the door towards the door open position. In some cases, the latch comprises a latch body slidably coupled to the main body and movable between a latched position and an unlatched position. The latch does not secure the door when the latch body is in the unlatched position. The pass-through device further comprises a latch biasing element for biasing the latch body towards the latched position, and the actuator is slidable to move the latch body towards the unlatched position. In some cases, the second seal segment is coupled to a seal base slidably captured within a slot of the main body. The door is coupled to the seal base through a linkage such that moving the door towards the door closed position induces the seal base to move the second seal segment towards the closed position. In some cases, the door includes a door seal for sealing a perimeter of the barrier opening when in the door closed position. In some cases, the barrier is a wall of a computer chassis.

Embodiments of the present disclosure include a method for passing a cable through a barrier that comprises providing the barrier, which includes a barrier opening, and coupling a pass-through device to the barrier at the barrier opening. The pass-through device comprises a main body couplable to a barrier having a barrier opening. The main body has an opening aligned with the barrier opening. The pass-through device further comprises an elastomeric first seal segment coupled to the main body at the opening of the main body, and an elastomeric second seal segment positioned adjacent the first seal segment and movable between an open position and a closed position. The second seal segment is spaced apart from the first seal segment in the open position and compressed against the first seal segment in the closed position. The first seal segment and the second seal segment are shaped to receive and compress against a cable therebetween when the second seal segment is in the closed position. The pass-through device further comprises a door coupled to the main body and the second seal segment. The door is movable between a door open position and a door closed position. Movement of the door to the door closed position induces the second seal segment to move to the closed position. Movement of the door to the door open position induces the second seal segment to move to the open position. The pass-through device further comprises a latch for securing the door in the door closed position and an actuator coupled to the latch for releasing the latch. The method further comprises actuating the actuator and moving the door to the door open position in response to actuating the actuator. The method further comprises inserting the cable between the first seal segment and the second seal segment. The method further comprises moving the door to the door closed position, wherein moving the door to the door closed position moves the second seal segment into the closed position. The method further comprises securing the door in the door closed position.

In some cases, the first seal segment comprises a first cable opening for receiving the cable, and the second seal segment comprises a second cable opening for receiving the cable. In some cases, at least one seal segment of the first seal segment and the second seal segment comprises compression grooves adjacent the cable opening to facilitate establishing an airtight seal between the seal segment and the cable when the second seal segment is in the closed position. In some cases, the first seal segment comprises a first angled surface for urging the cable towards the first cable opening. In some cases, the second seal segment comprises a second angled surface for urging the cable towards the second cable opening. In some cases, the pass-through device further comprises a door biasing element for biasing the door towards the door open position. In some cases, the latch comprises a latch body slidably coupled to the main body and movable between a latched position and an unlatched position. The latch does not secure the door when the latch body is in the unlatched position. The pass-through device further comprises a latch biasing element for biasing the latch body towards the latched position. Actuating the actuator comprises sliding the actuator to cause the latch body to move to the unlatched position. In some cases, the second seal segment is coupled to a seal base slidably captured within a slot of the main body, wherein the door is coupled to the seal base through a linkage. Moving the door to the door closed position induces the seal base to move the second seal segment towards the closed position. In some cases, the door includes a door seal for sealing a perimeter of the barrier opening when in the door closed position. In some cases, providing the barrier comprises providing a computer chassis having a wall, wherein the barrier is the wall of the computer chassis.

BRIEF DESCRIPTION OF THE DRAWINGS

The specification makes reference to the following appended figures, in which use of like reference numerals in different figures is intended to illustrate like or analogous components.

DETAILED DESCRIPTION

Certain aspects and features of the present disclosure relate to a pass-through device for sealing an opening of a barrier while permitting one or more cables to pass through the opening. The pass-through device can include a two-part seal that can move between an open position that permits insertion of a cable, and a closed position that establishes an airtight seal around the cable. The two-part seal can include a stationary seal segment and a moving seal segment. The moving seal segment can be moved away from the stationary seal segment by unlatching and opening a door on the pass-through device. A cable can be placed between the seal segments and the door can be closed until it latches, thus sealing the cable between the seal segments. The seal segments can include inclines to urge the cable towards cable openings of the seal segments. In some cases, the two-part seal can include openings for multiple cables.

The pass-through device disclosed herein can be attached to any suitable barrier where an airtight seal is desired, such as a wall of a computer chassis. As used herein, a computer chassis can include a container housing a computer system and having a define airflow path therethrough. Other computer chassis can be used. In some cases, a chassis can include a housing for an individual computer (e.g., a single rack-mounted server) or a housing for multiple computers (e.g., a blade server chassis or a server rack). The pass-through device can be attached around an opening in the barrier.

The pass-through device can include a main body having an opening that is aligned with an opening in a barrier when the pass-through device is installed on the barrier. The pass-through device can be attached to the barrier using any suitable technique, such as fasteners (e.g., bolts, screws, rivets, or the like). One or more seals can seal the pass-through device to the barrier such that air cannot pass from inside the barrier out behind an edge of the pass-through device.

The opening of the pass-through device can include a multi-part cable seal, such as a two-part cable seal. This cable seal can include one or more cable openings for one or more cables. The cable seal can include a first seal segment and a second seal segment, such as a bottom seal segment and a top seal segment. The first seal segment can be statically coupled in place to the main body of the pass-through device, although that need not always be the case. The second seal segment can be slidably coupled to the main body to permit the seal segment to move between an open position and a closed position. For example, when the second seal segment is above the first seal segment, the second seal segment can move upwards into the open position and can move downwards into the closed position.

The seal segments can be made of an elastomeric material, such as silicon rubber. In the closed position, the first and second seal segments are compressed together. When a cable is positioned in a cable opening of the cable seal and the second seal segment is moved to the closed position, the first and second seal segments can compress against the cable to establish an airtight seal around the cable. In some cases, one or more of the seal segments can include compression grooves that permit increased elastic deformation in the area with the compression groves. When compression groves are used surrounding part or all of a cable opening, the increased elastic deformation in that area can permit cables of various diameters to be used in the same cable opening. For example, a cable of a first diameter (e.g., a small diameter) may only slightly deform the cable seal around the cable opening to create an airtight seal, whereas a cable of a second diameter (e.g., a large diameter) that is larger than the first diameter may deform the cable seal around the cable opening further to create an airtight seal. Additionally, since compression grooves can be formed in a seal segment without creating a seam, the compression groove is a technique for permitting cables of differing diameters to be used in the same pass-through device while still maintaining strong sealing that may otherwise be impossible if the seal segment had included seams.

The pass-through device can be created in any suitable size. In one example, the pass-through device is sized such that the cable opening of the cable seal is approximately 8 mm (e.g., 7 mm, 7.5 mm, 8 mm, 8.5 mm, 9 mm, 9.5 mm, or 10 mm) in diameter. The use of compression grooves can allow such a cable opening to receive and seal cables having a diameter that is approximately the same as the diameter of the cable opening, up through cables having a diameter that is approximately 1 mm, 2 mm, 3 mm, or 4 mm greater than the diameter of the cable opening. The size of the cable opening, the size and number of compression grooves, and/or the type of elastomeric material used for the cable seal can be adjusted for any suitable cable size or range of cable sizes desired to be used with the pass-through device. In some cases, one or more inserts can be used to adapt a pass-through device for smaller cables (e.g., cables at or below the diameter of the cable opening).

In some cases, one or both of the seal segments can include an inclined surface that can urge the one or more cables into the one or more cable openings. For example, inclined surfaces on a first seal segment can be inclined towards a cable opening such that a cable placed on any such inclined surfaces would tend to move towards the cable opening, whether due to gravity or due to force applied by the second seal segment when the second seal segment is moved towards the first seal segment.

Movement of one or both seal segments of the cable seal can be achieved by opening and closing a door of the pass-through device. In an example, a second seal segment can be attached to a seal base that moves linearly within a track (e.g., slot) of the main body of the pass-through device. The door can be hinged at a first end and can be coupled to the seal base via a linkage, such that movement of the door to an open position raises the seal body, and thus the second seal segment, while movement of the door to a closed position lowers the seal body, and thus the second seal segment. The door and the linkage can act as a lever for opening and closing the cable seal, thus providing some amount of mechanical advantage. The amount of mechanical advantage provided can be tailored by adjusting the distance between the hinge and the linkage and/or the distance between the hinge and the second end of the door.

The door and linkage can be configured to provide sufficient mechanical advantage to ensure a user is able to easily move the door from an open position to a closed position, especially given the expected resistance resulting from compression of the cable seal around a cable. Thus, the use of stiffer elastomeric materials may require a larger mechanical advantage. Or, if space is limited, the maximum mechanical advantage may be smaller, which may lead to the use of less-stiff elastomeric materials.

The door can be secured in a closed position by one or more latches. In some cases, the door can be biased to an open position, such as through the use of a biasing element, such as a torsion spring at the hinge of the door. In such cases, when the one or more latches securing the door are released, the door can automatically move to the open position due to the biasing element. The one or more latches can be coupled to a latch body that is slidably coupled to the main body of the pass-through device. Thus, sliding the latch body can separate the one or more latches from the door sufficiently to unsecure the door, thus allowing the door to move to the open position. The latch body can be moved through use of an actuator. Any suitable actuator can be used, although in some cases, the actuator is a sliding button (e.g., a structure upon which a finger can be placed to slide the actuator). Other actuators can be used, such as depressible buttons, electronic actuators, keyed actuators, or the like.

Certain aspects of the present disclosure are especially useful for providing pass-through seals on walls of computer chassis. Certain aspects of the present disclosure permit easy, one-handed access to open the two-part seal to allow a cable to be inserted, then to close the two-part seal to seal the cable therein. The use of inclined surfaces that direct the cable into a cable opening further facilitate one-handed use of the pass-through device. One-handed use of a pass-through device can be especially useful with respect to computer chassis. For example, while one hand is securing the computer chassis or manipulating a part within the computer chassis, the other hand can grasp the cabling to be passed through the wall of the chassis, and use a single finger on that hand to quickly and easily open the pass-through device. Then, the large surface area provided by the door can make it easy for that same hand to close the pass-through device once sufficient cabling has been fed therethrough. Additionally, certain aspects of the present disclosure permit the pass-through device to be modular and easily installable on a chassis when needed.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

Figure 1:
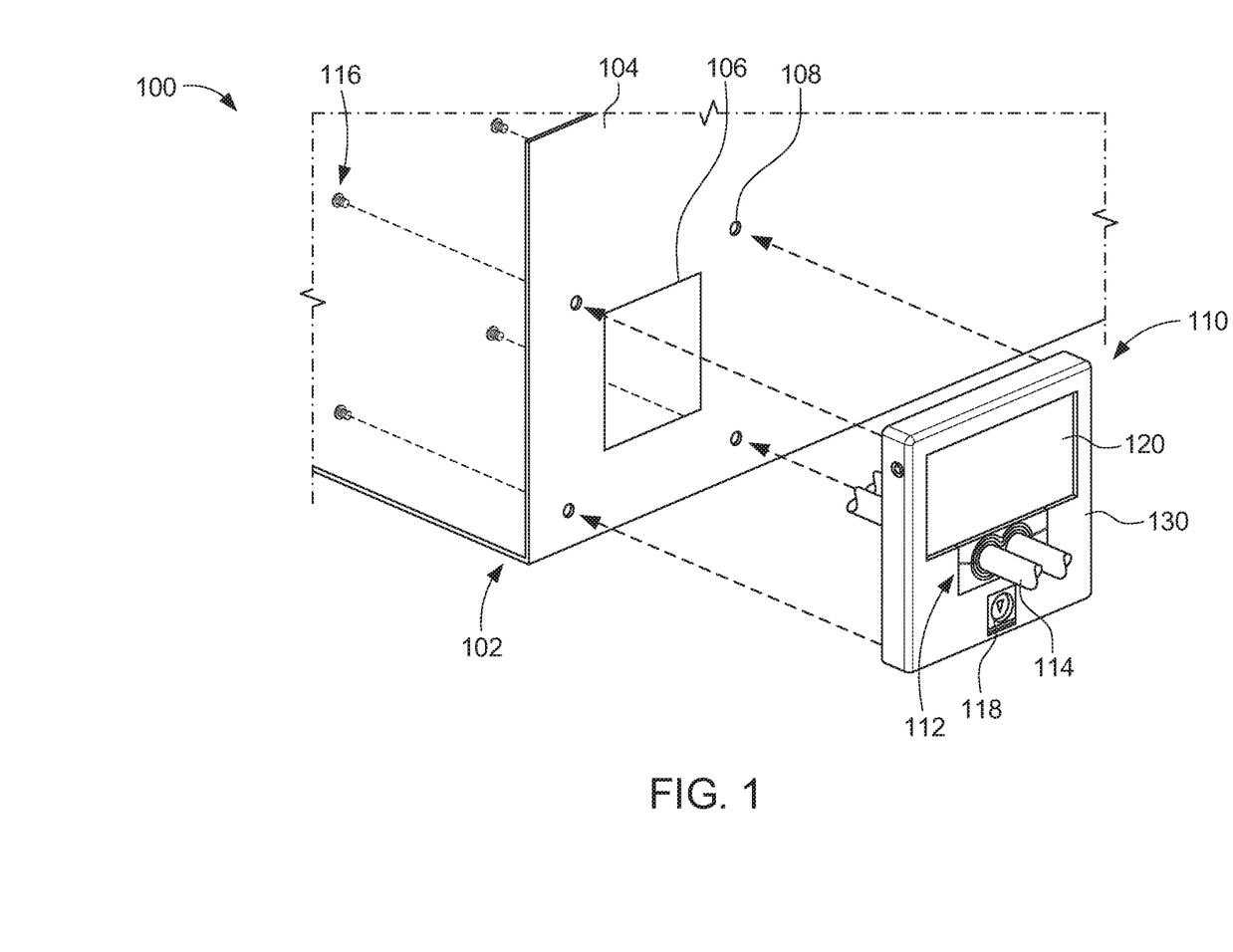
FIG. 1 is a partially exploded view of a system comprising a pass-through device and a computer chassis, according to certain aspects of the present disclosure.

FIG. 1 is a partially exploded view of a system 100 comprising a pass-through device 110 and a computer chassis 102, according to certain aspects of the present disclosure. The chassis 102 can include a wall 104 having an opening 106 through which a cable can be passed. The opening 106 can be in any suitable shape, although depicted as a rectangle in FIG. 1. Any suitable chassis 102 can be used.

The pass-through device 110 can be coupled to chassis 102 using any suitable technique, such as through the use of fasteners 116. Fasteners 116 can pass through fastener holes 108 and be secured to the pass-through device 110. For example, fasteners 116 can be bolts that screw into associated receiving nuts within the pass-through device 110. In some cases, the pass-through device 110 can include a seal that seals around the perimeter of opening 106, thus preventing air leakage between the edges of the pass-through device 110 and the wall 104.

The pass-through device 110 can include a main body 130 with a door 120, an actuator 118, and a cable seal 112. The cable seal 112 can be a two-part seal, which can separate upon opening of door 120 and can close together upon closing of door 120. Door 120 can be biased open, but secured in a closed position through the use of a latch. Actuator 118, which can be a slidable button, can disengage the latch, thereby permitting the door 120 to open, and thus permitting the cable seal 112 to open (e.g., permitting seal segments to separate).

The cable seal 112 can be used to establish an airtight seal around cables 114. Any suitable cables 114 can be used, such as power cables. While the pass-through device 110 of FIG. 1 is depicted as sealing two cables 114, in some cases, a pass-through device can be configured to accept one cable or more than two cables.

Figure 2:
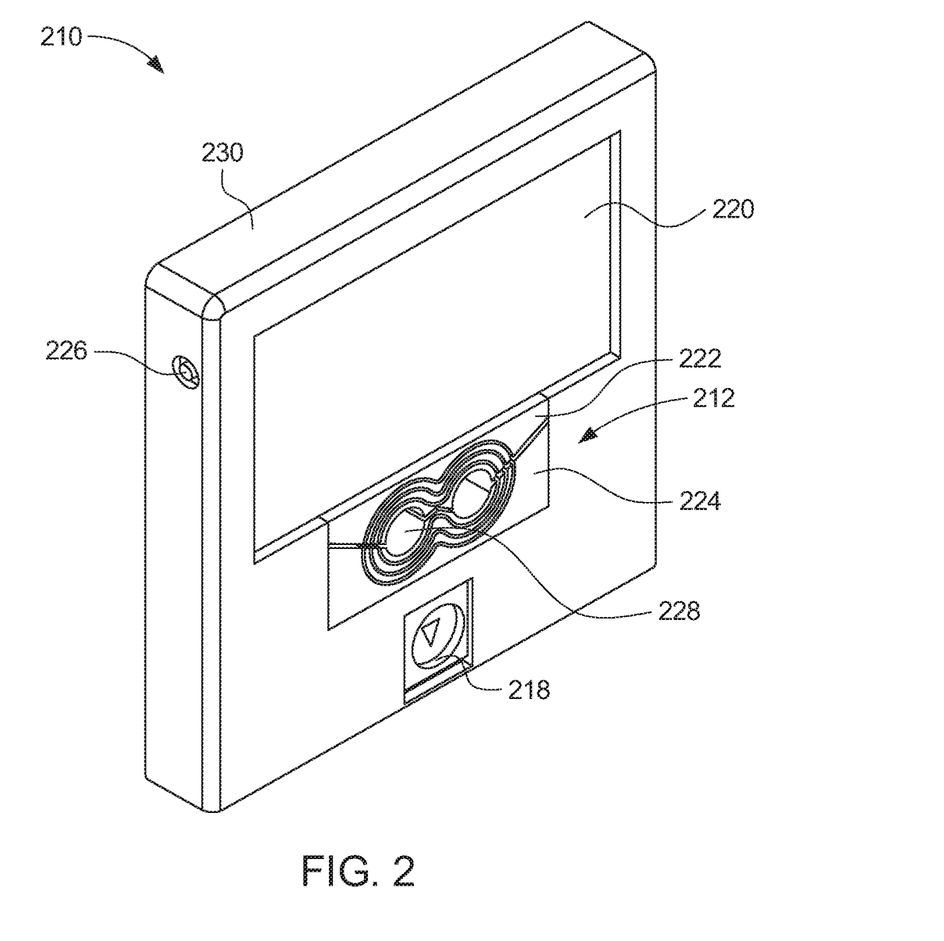
FIG. 2 is an isometric view of a pass-through device in a closed configuration, according to certain aspects of the present disclosure.

FIG. 2 is an isometric view of a pass-through device 210 in a closed configuration, according to certain aspects of the present disclosure. Pass-through device 210 can be pass-through device 110 of FIG. 1. The pass-through device 210 can include a main body 230. A door 220 can be coupled to the main body 230 at a hinge 226, permitting the door 220 to swing open or closed about the hinge 226. The door 220 can be secured in a closed position until actuator 218 is pressed, at which point the door 220 can open by rotating about hinge 226. In some cases, the door 220 can move approximately 90° between the closed position and the open position.

In the closed configuration, the door 220 is in a closed position. In the closed position, the door 220 causes the cable seal 212 to be closed together, thus sealing around any cables that may be located in cable openings 228. The cable seal 212 can include a first seal segment 224 and a second seal segment 222. As depicted in the pass-through device 210 of FIG. 2, the first seal segment 224 is statically coupled to the main body 230, while the second seal segment 222 is slidable between an open position and a closed position. The second seal segment 222 is currently secured in the closed position due to the door 220 being secured in the closed position.

Figure 3:
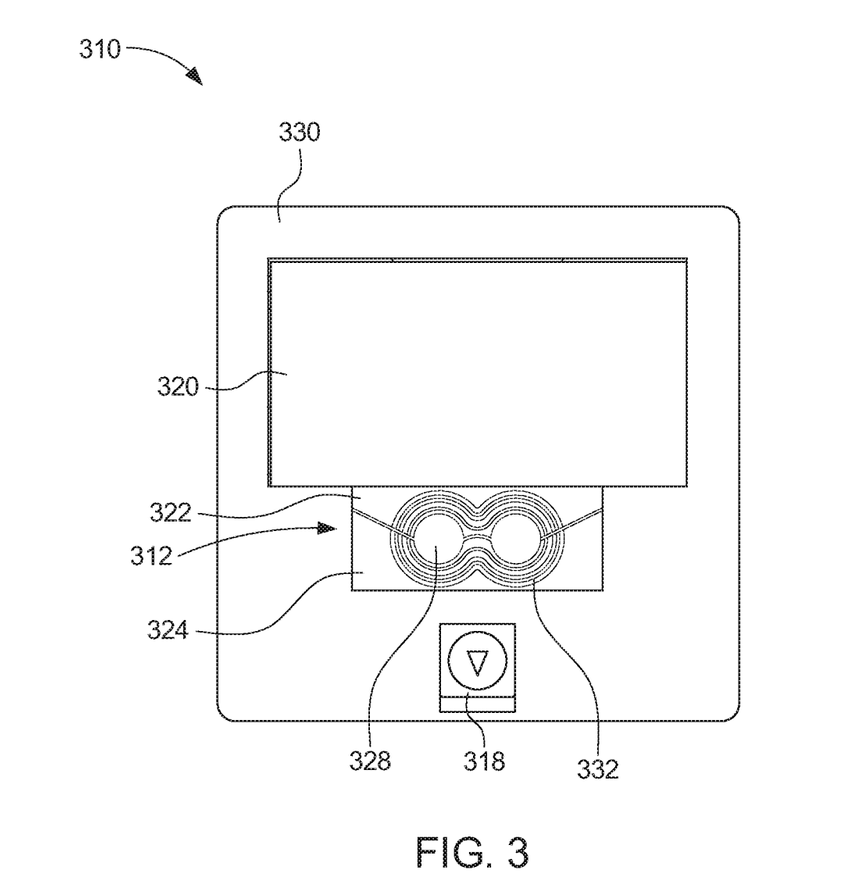
FIG. 3 is a front view of a pass-through device in a closed configuration, according to certain aspects of the present disclosure.

FIG. 3 is a front view of a pass-through device 310 in a closed configuration, according to certain aspects of the present disclosure. Pass-through device 310 can be pass-through device 210 of FIG. 2. The pass-through device 310 includes a main body 330. A door 320 can be coupled to the main body 330 and secured in a closed position until a user slides the slidable actuator 318, thus disengaging the door 320 and permitting the door 320 to move to an open position. In the closed position, the door 320 can force the second seal segment 322 of the cable seal 312 against the first seal segment 324. This force can establish a seal around any cable that might be placed in the cable openings 328 of the cable seal 312.

The cable seal 312 can include one or more compression grooves 332 at or around the cable openings 328. The compression grooves 332 can be grooves formed in the elastomeric material of the cable seal 312. The depth, thickness, and number of compression grooves 332 can be selected or adjusted to accommodate desired cable diameter ranges. The compression grooves 332 permit easier elastic deformation of the cable seal 312 around the cable openings 328 than at ends of the cable seal 312 away from the cable openings 328. Thus, when a cable that has a diameter greater than the cable opening 328 is placed in the cable seal 312, the compression grooves 332 can deform to establish a seal around the cable while still permitting the regions of the cable seal 312 distant from the cable openings 328 (e.g., regions to the far left or far right, as seen in FIG. 3) to compress against one another and seal.

In some cases, compression grooves 332 can be replaced by the use of a multi-material cable seal 312, in which case the region(s) at and/or around the cable openings 328 can be made of an elastomeric material that is less stiff (e.g., has a lower elastic modulus) than the elastomeric material used for the remainder of the cable seal 312.

Figure 4:
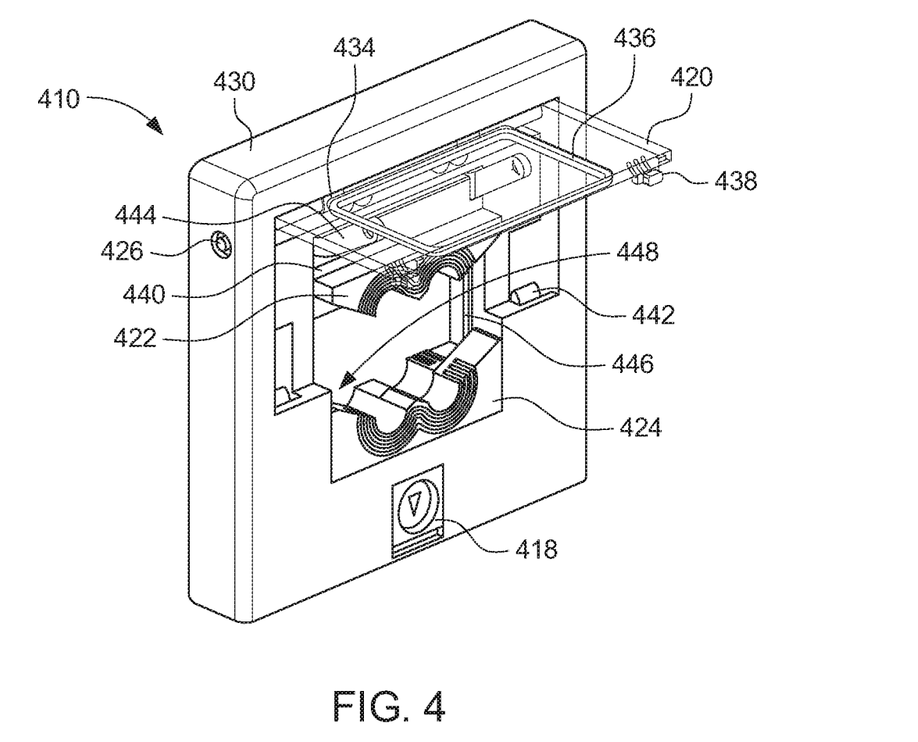
FIG. 4 is an isometric view of a pass-through device in an open configuration, according to certain aspects of the present disclosure.

FIG. 4 is an isometric view of a pass-through device 410 in an open configuration, according to certain aspects of the present disclosure. Pass-through device 410 can be pass-through device 110 of FIG. 1 in an open configuration. For illustrative purposes, door 420 is depicted as see-through. While door 420 can be made of a see-through material, that need not always be the case.

Door 420 is coupled to the main body 430 by hinge 426 to rotate between an open position (as depicted in FIG. 4) and a closed position (e.g., door 220 of FIG. 2). Door 420 can be biased into the open position by biasing element 434. Biasing element 434 is depicted as a torsion spring, although other biasing devices can be used.

The cable seal of pass-through device 410 can be in an open position, with the second seal segment 422 spaced apart from (e.g., raised away from) the first seal segment 424. The first seal segment 424 can be coupled to the main body 430 within an opening 448 of the main body. The first seal segment 424 can be statically coupled to the main body 430, such that the first seal segment 424 does not move with respect to the main body 430. The second seal segment 422, however, can be slidably coupled to the main body 420, such that the second seal segment 422 is able to slide (e.g., in an up-down direction as depicted in FIG. 4) within the opening 448 of the main body 420. The second seal segment 422 can slide between an open position (as depicted in FIG. 4) and a closed position (e.g., second seal segment 222 of FIG. 2).

The second seal segment 422 can be captured within a track 446 (e.g., a slot) within the main body 430. In some cases, the second seal segment 422 can be coupled to the main body 430 in other fashions. The second seal segment 422 can be coupled to a seal base 440. Seal base 440 can slide (e.g., in an up-down direction as depicted in FIG. 4) with respect to the main body 430 to move the second seal segment 422 accordingly. The seal base 440 can be captive within the track 446. In some cases, track 446, seal base 440, and/or the second seal segment 422 can include a material having a low coefficient of friction to facilitate sliding of the second seal segment 422.

The door 420 can be coupled to the seal base 440 via linkages 444. Rotation of the door 420 about the hinge 426 from the open position to the closed position can cause the seal base 440, and thus the second seal segment 422, to move towards the first seal segment 424.

Door 420 can include latch elements 438 that engage corresponding latches 442 of the pass-through device 410 when the door 420 is moved to a closed position. Latches 442 can be retracted to disengage the door 420 by application of force (e.g., downward force as depicted in FIG. 4) on actuator 418. Disengagement of the door 420 can result in the door 420 automatically being moved to the open position by biasing element 434. Latches 442 and/or latch elements 438 can be shaped (e.g., with inclined surfaces) to permit the door 420 to be closed without needing to apply force on actuator 418. For example, the act of closing door 420 can cause latch elements 438 to push against latches 442 and temporarily cause latches 442 to retract until the latch elements 438 have passed latches 442, at which point the latches 442 extend again and engage latch elements 438 to secure the door 420 in a closed position.

Door 420 can include a seal 436. Seal 436 can be positioned to seal the door 420 from air leakage by establishing a seal around portions of the main body 430 and the seal base 440 and/or second seal segment 422 behind the door 420 when the door 420 is in the closed position.

Figure 5:
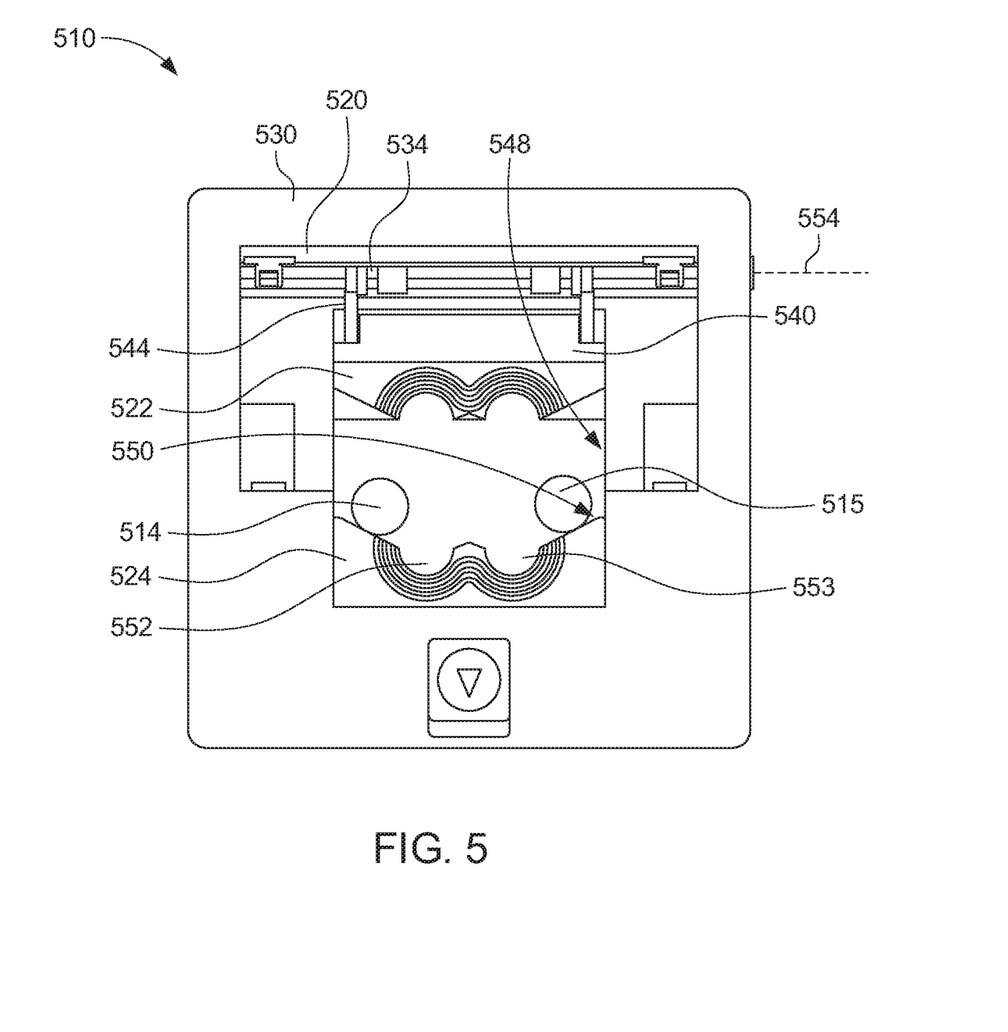
FIG. 5 is a front view of a pass-through device in an open configuration, according to certain aspects of the present disclosure.

FIG. 5 is a front view of a pass-through device 510 in an open configuration, according to certain aspects of the present disclosure. Pass-through device 510 can be pass-through device 410 of FIG. 4. The main body 530 of the pass-through device 510 can include an opening 548 that can be aligned with an opening in a barrier (e.g., chassis wall) to which the pass-through device 510 is attached.

Door 520 is depicted in an open position. Door 520 is coupled to the main body 530 by a hinge, thus permitting door 520 to rotate about an axis of rotation 554. Door 520 can be coupled to seal base 540 by linkages 544. Each linkage 544 can be rotatably coupled to the door 520 and the seal base 540. Two linkages 544 are depicted in FIG. 5, although any suitable number of linkages can be used. Seal base 540 can be coupled to the second seal segment 522. Movement of the door 520 from the open position (e.g., as depicted in FIG. 5) to a closed position (e.g., door 320 of FIG. 3) can cause the linkages 544 to push the seal base 540, and thus the second seal segment 522, towards the first seal segment 524.

One or both of the first seal segment 524 and second seal segment 522 can include features to urge any cables 514, 515 within the opening 548 towards respective cable openings 552, 553. As depicted in FIG. 5, the first seal segment 524 includes inclined planes 550 (e.g., inclined planes on opposite sides of and between cable openings 552, 553) that can cause cable 514 to move towards cable opening 552 and cause cable 515 to move towards cable opening 553. This movement can be due to gravity pulling down on cables 514, 515, or can be as a result of applied force from the second seal element 522 when the second seal element 522 is moved towards the first seal element 524.

Figure 6:
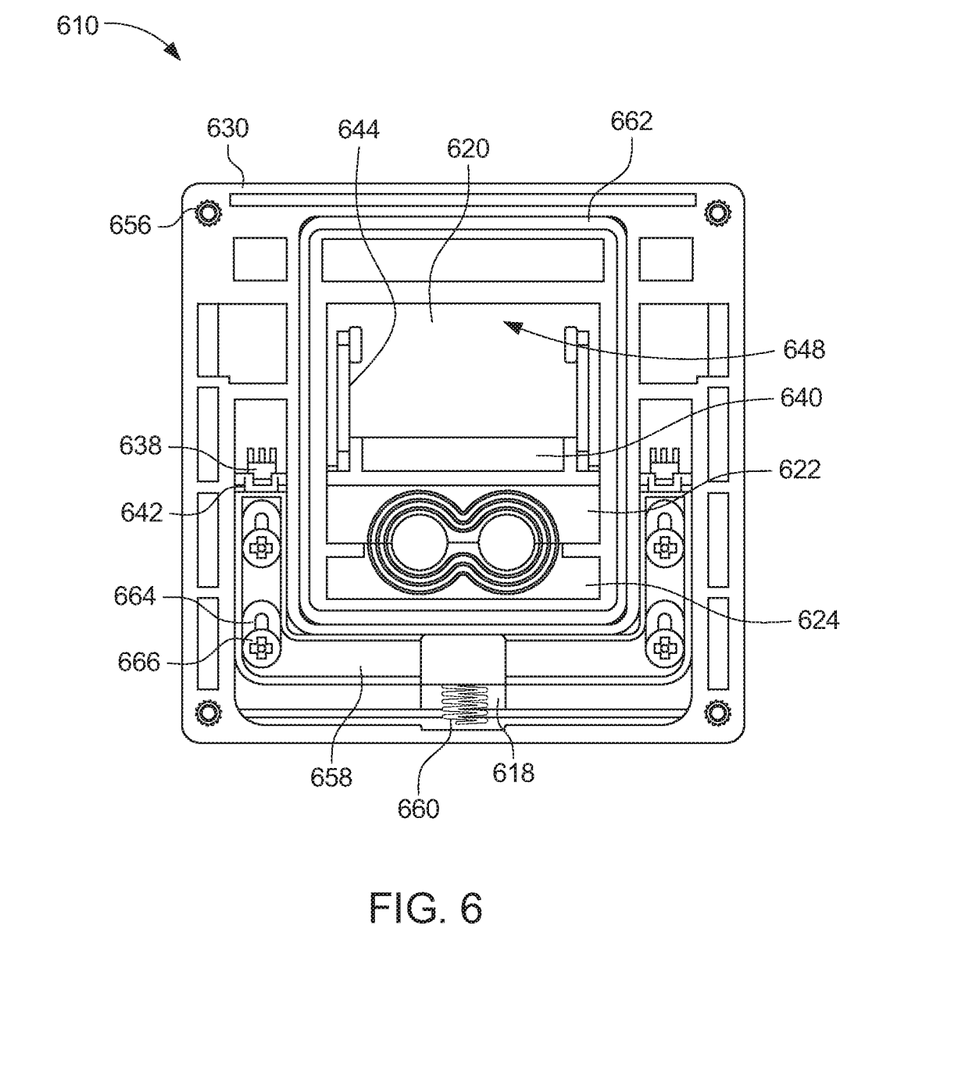
FIG. 6 is a rear view of a pass-through device in a closed configuration, according to certain aspects of the present disclosure.

FIG. 6 is a rear view of a pass-through device 610 in a closed configuration, according to certain aspects of the present disclosure. Pass-through device 610 can be pass-through device 210 of FIG. 2.

The main body 630 can have an opening 648. Door 620 is seen through the opening 648. A door seal (e.g., seal 436 of FIG. 4) can stop air leakage past door 620. The main body 630 can include a seal 662 to stop air leakage past the edges of the main body 630. The seal 662 of the main body 630 can be pressed against the barrier (e.g., chassis wall) to which the pass-through device 610 is coupled.

As depicted in FIG. 6, the pass-through device 610 is in a closed configuration. Thus, the closed door 620 is forcing or has forced the second seal segment 622 against the first seal segment 624 via linkages 644 and seal base 640. In the closed position, latch elements 638 of door 620 can engage latches 642. Latches 642 can be part of and/or can include a latch body 658. As depicted in FIG. 6, a single latch body 658 can be coupled to and/or can include two latches 642. The latch body 658 can be slidably coupled to the main body 630. For example, fasteners 666 can pass through latch body slots 664 in the latch body 658 to couple the latch body 658 to the main body 630. Thus, the latch body 658 is able to slide due to the interaction of fasteners 666 and latch body slots 664. A biasing element 660, such as a spring, can bias the latches 642 into an extended position (e.g., a position in which the latches 642 are able to engage the door 620), such as via latch body 658. Application of force (e.g., downward force as depicted in FIG. 6) can overcome the biasing element 660 and cause the latches 642 to retract, thus disengaging and releasing the door 620.

In some cases, the main body 630 can include fastener receivers 656 to facilitate coupling the pass-through device 610 to a barrier. The fastener receivers 656 can be nuts for receiving bolts, although other structures able to receive a fastener can be used. In some cases, fastener receivers 656 are made of materials different from the main body 630, although that need not always be the case.

Figure 7:
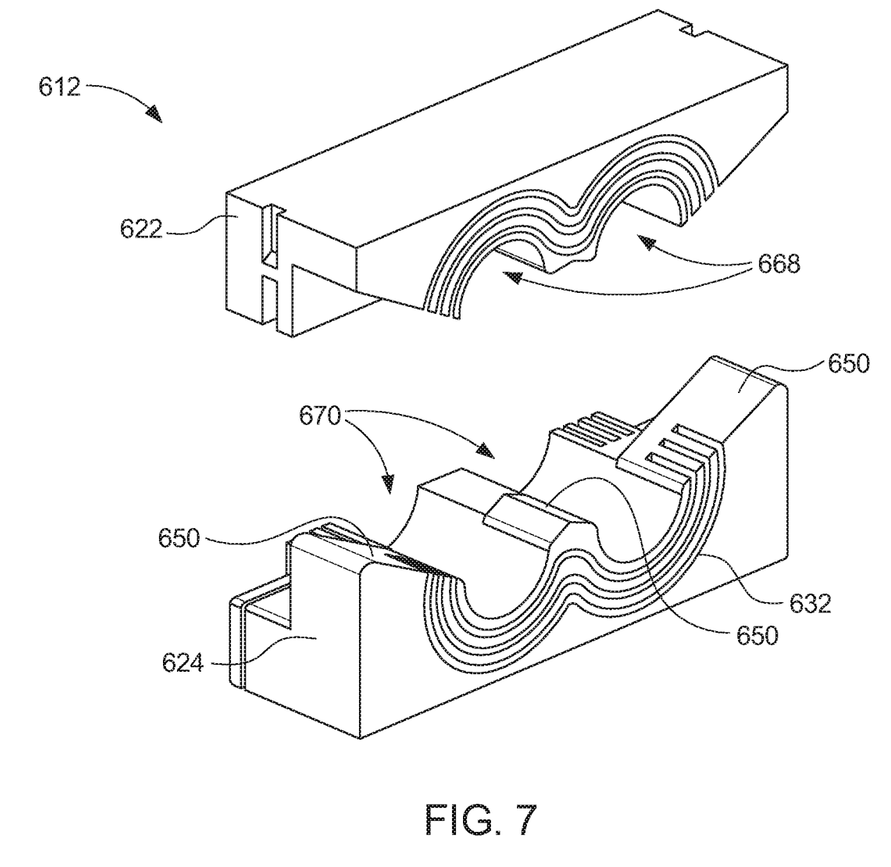
FIG. 7 is an isometric view of a first seal segment and a second seal segment, according to certain aspects of the present disclosure.

FIG. 7 is an isometric view of a first seal segment 624 and a second seal segment 622, according to certain aspects of the present disclosure. The first seal segment 624 and second seal segment 622 can make up the cable seal 612. The cable seal 612 can be cable seal 212 of FIG. 2.

Cable seal 612 can have two cable openings, each for receiving a cable. The cable openings can be formed by cable openings 670, 668 of the first seal segment 624 and the second seal segment 622, respectively. Cable openings 670 of the first seal segment 624 can take the form of half-circles or approximate half-circles. Likewise, cable openings 668 of the second seal segment 622 can take the form of opposite half-circles or approximate half-circles that correspond to the cable openings 670 of the first seal segment 624.

In some cases, one or both of the first seal segment 624 and second seal segment 622 can include inclined surfaces 650. In some cases, the first seal segment 624 includes inclined surfaces 650 that are inclined towards adjacent cable openings 670. When located between cable openings 670, the inclined surfaces 650 can take the form of a pointed, multi-segment, or rounded arch, thus causing any cable resting thereon to be forced into one of the adjacent cable openings 670 either due to gravity or due to force applied from the second seal segment 622 (e.g., during movement of the second seal segment 622 towards the first seal segment 624).

In some cases, one or both of the first seal segment 624 and second seal segment 622 can include compression grooves 632. Compression grooves 632 can be located at or around the cable openings 668, 670. Compression grooves 632 can permit the portions of the first seal segment 624 and second seal segment 622 that define the cable openings 668, 670 to elastically deform more than the remaining portions of the first seal segment 624 and second seal segment 622. Thus, when a cable is placed within the cable openings 668, 670, the regions with the compression grooves 632 can be easily deformed to ensure a tight seal is maintained both at those regions and at other regions of the cable seal 612 (e.g., interfaces between the first seal segment 624 and the second seal segment 622).

A compression groove 632 can be a groove-shaped void in the seal segment. Often, a compression groove 632 takes a curvilinear shape that corresponds to the shape of any cable openings 668, 670 in the seal segment. The compression groove 632 can extend partially through a depth of the seal segment, such as at or less than 90%, 80%, 70%, 60%, 50%, 40%, 30%, or 20%. Compression grooves 632 can be formed during initial forming of the seal segment (e.g., molding or additive printing), or can be created by any suitable subtractive method (e.g., drilling, cutting, and the like). In some cases, the compression grooves 632 can include a first set of grooves on a front side of the seal segment and a second set of grooves on the rear side of the seal segment. In such cases, the front and rear grooves can be aligned with one another or offset with respect to one another.

Figure 8:
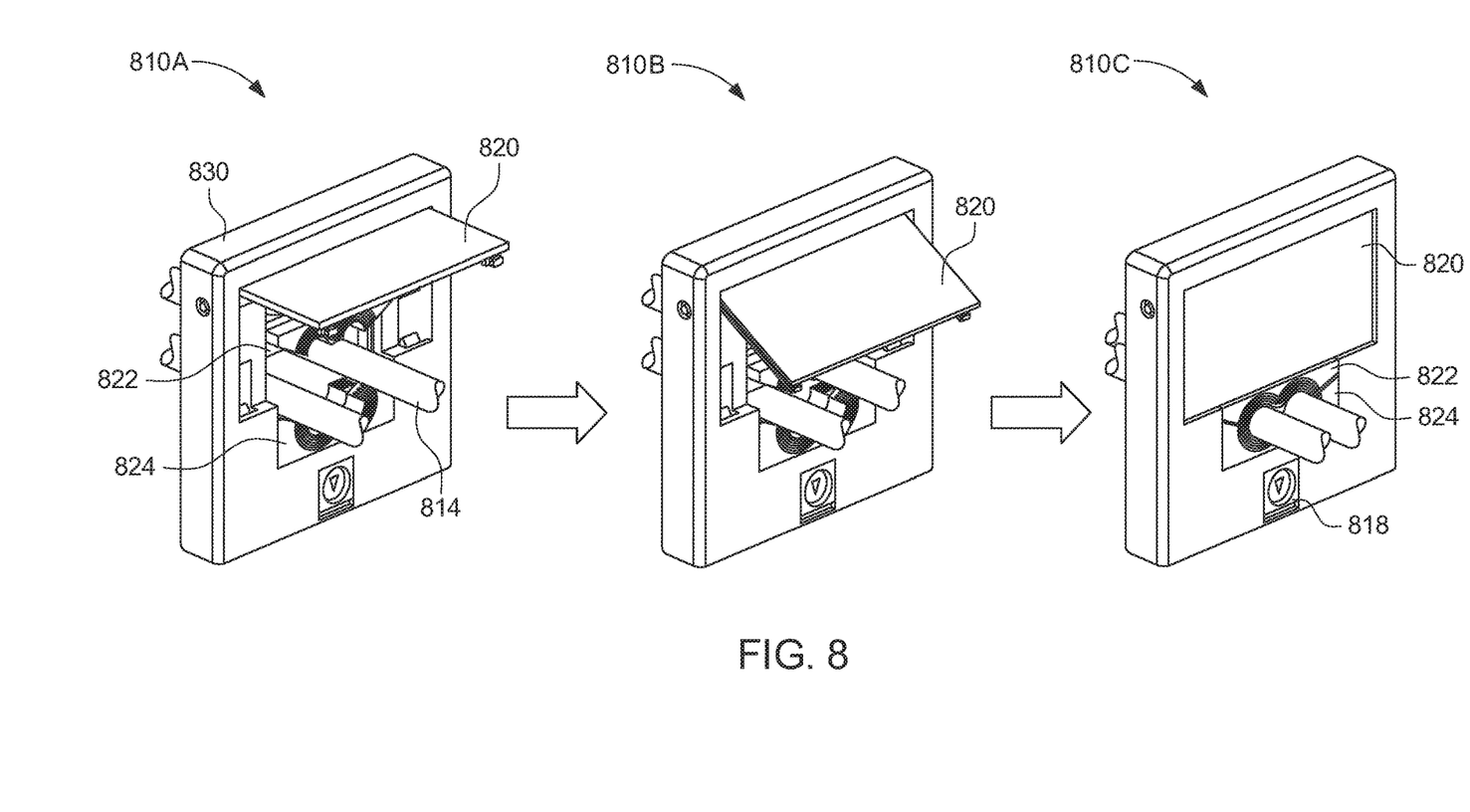
FIG. 8 is a progressive set of isometric views depicting a pass-through device in an open configuration, a pass-through device in a partially closed configuration, and a pass-through device in a closed configuration, according to certain aspects of the present disclosure.

FIG. 8 is a progressive set of isometric views depicting a pass-through device in an open configuration 810A, a pass-through device in a partially closed configuration 810B, and a pass-through device in a closed configuration 810C, according to certain aspects of the present disclosure. The pass-through devices 810A, 810B, 810C can be pass-through device 110 of FIG. 1.

The pass-through device in the open configuration 810A can have its door 820 in the open position (e.g., position orthogonal to a front surface of the main body 830), which can cause the second seal segment 822 to be spaced apart from the first seal segment 824, thus creating a wide opening therebetween. One or more cables 814 can be moved into the opening. Because of the wide opening, terminations (e.g., connectors) of the cables 814 can easily pass through without difficulty, even if wide or large terminations are used. Pressing down on the door 820 of the pass-through device in the open configuration 810A can lead to the pass-through device in the partially closed configuration 810B. In this configuration, the door 820 has been moved partially towards a closed position, thus causing the second seal segment 822 to have moved partially towards the first seal segment 824. The second seal segment 822 can initially make contact with the cables 814.

Further pressure applied to door 820 of the pass-through device in the partially closed configuration 810B can lead to the pass-through device in the closed configuration 810C. In this configuration, continued movement of the second seal segment 822 towards the first seal segment 824 can cause the cables 814 to move into cable openings of the cable seal. The door 820 can be in a closed position and latched in place. When the door 820 is in a closed position, the second seal segment 822 can be compressed against the first seal segment 824 with sufficient force to establish an airtight seal. This airtight seal can include all interfaces between the first seal segment 824, the second seal segment 822, and any cables 814 in the cable openings.

If sufficient downward force is applied to the actuator 818 of the pass-through device in the closed configuration 810C, the latches holding the door 820 in the closed position can disengage, thereby permitting the door 820 to move to the open position and resulting in the pass-through device in the open configuration 810A.

Figure 9:
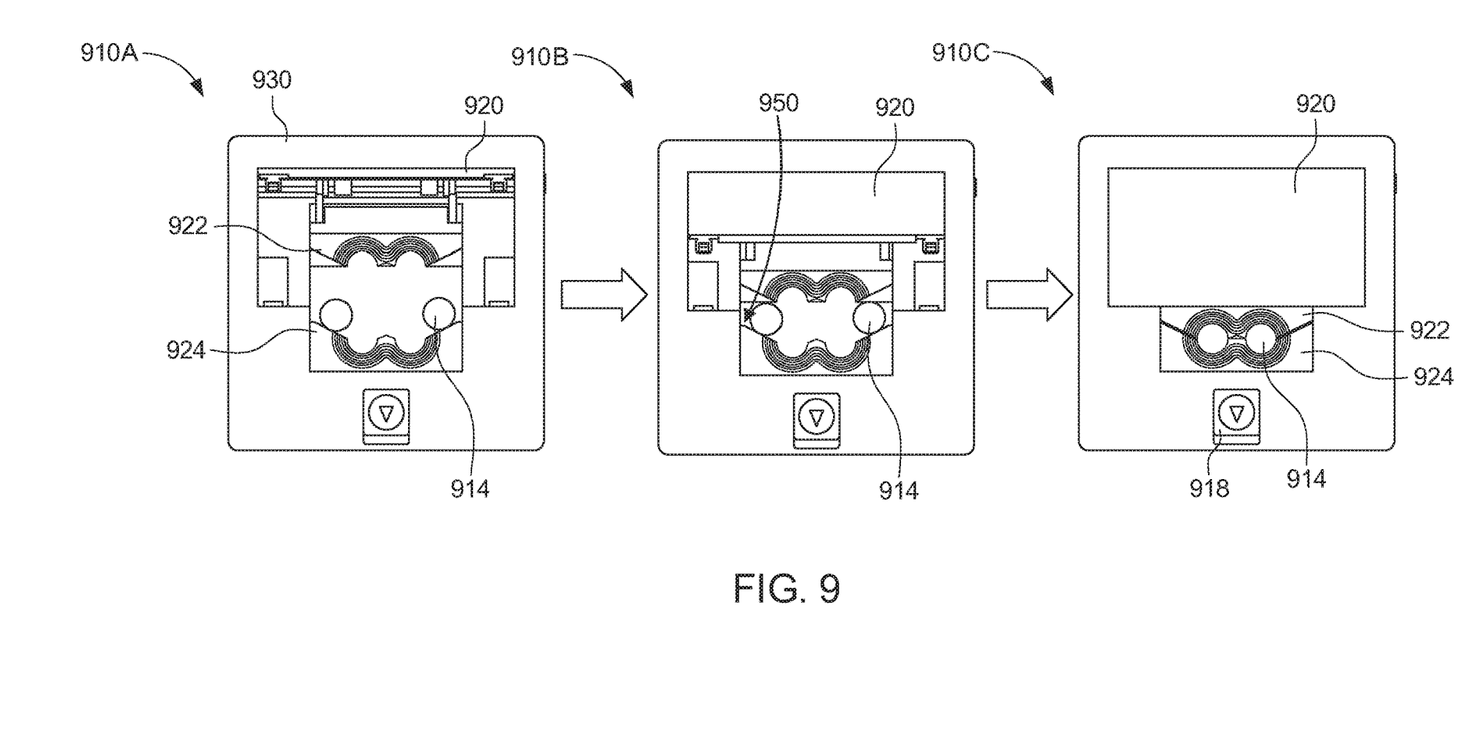
FIG. 9 is a progressive set of front views depicting a pass-through device in an open configuration, a pass-through device in a partially closed configuration, and a pass-through device in a closed configuration, according to certain aspects of the present disclosure.

FIG. 9 is a progressive set of front views depicting a pass-through device in an open configuration 910A, a pass-through device in a partially closed configuration 910B, and a pass-through device in a closed configuration 910C, according to certain aspects of the present disclosure. The pass-through devices 910A, 910B, 910C can be pass-through devices 810A, 810B, 810C of FIG. 8, respectively.

The pass-through device in the open configuration 910A can have its door 920 in the open position (e.g., position orthogonal to a front surface of the main body 930), which can cause the second seal segment 922 to be spaced apart from the first seal segment 924, thus creating a wide opening therebetween. One or more cables 914 can be moved into the opening. Because of the wide opening, terminations (e.g., connectors) of the cables 914 can easily pass through without difficulty, even if wide or large terminations are used. Pressing down on the door 920 of the pass-through device in the open configuration 910A can lead to the pass-through device in the partially closed configuration 910B. In this configuration, the door 920 has been moved partially towards a closed position, thus causing the second seal segment 922 to have moved partially towards the first seal segment 924. The second seal segment 922 can initially make contact with the cables 914. Further pressure applied to the door 920 to force the second seal segment 922 towards the first seal segment 924 can cause cables 914 to be forced against inclined surfaces 950, thus causing cables 914 to be urged towards the cable openings.

Further pressure applied to door 920 of the pass-through device in the partially closed configuration 910B can lead to the pass-through device in the closed configuration 910C. The door 920 can be in a closed position and latched in place. When the door 920 is in a closed position, the second seal segment 922 can be compressed against the first seal segment 924 with sufficient force to establish an airtight seal. This airtight seal can include all interfaces between the first seal segment 924, the second seal segment 922, and any cables 914 in the cable openings.

If sufficient downward force is applied to the actuator 918 of the pass-through device in the closed configuration 910C, the latches holding the door 920 in the closed position can disengage, thereby permitting the door 920 to move to the open position and resulting in the pass-through device in the open configuration 910A.

Figure 10:
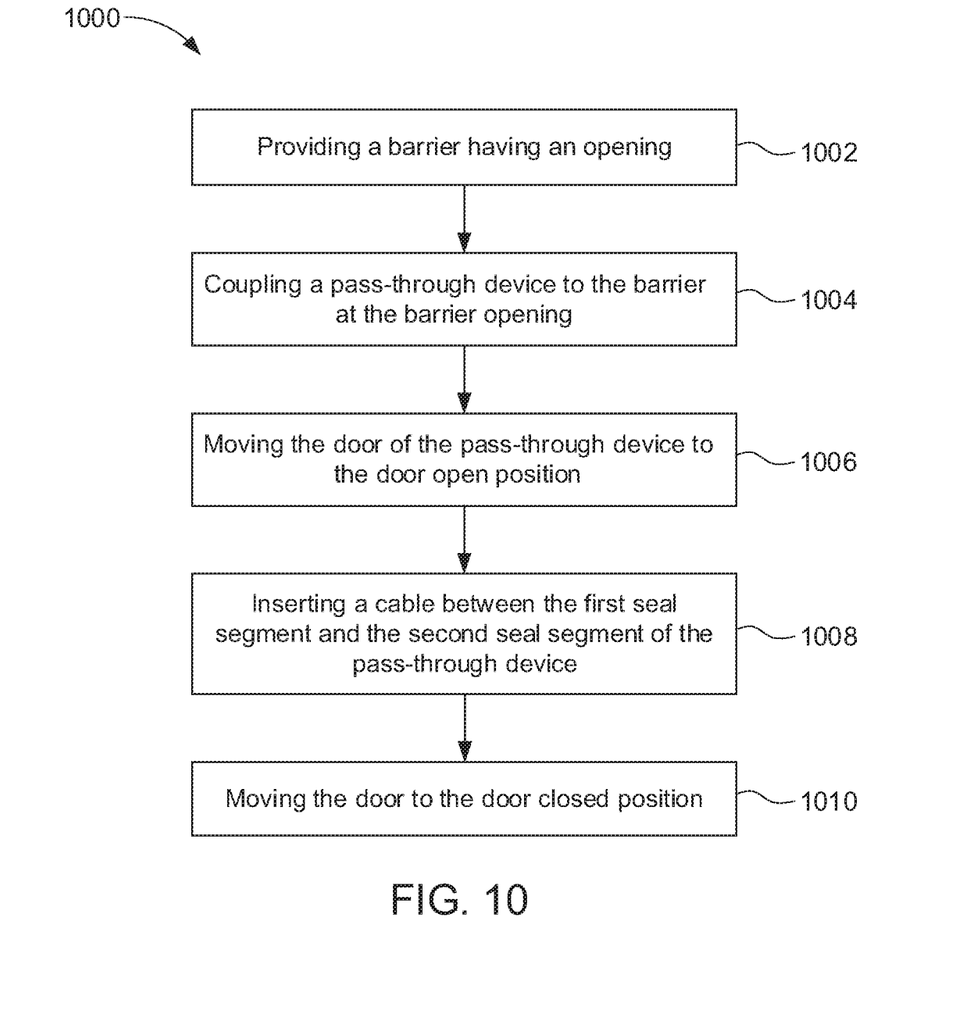
FIG. 10 is a flowchart depicting a process for using a pass-through device, according to certain aspects of the present disclosure.

FIG. 10 is a flowchart depicting a process 1000 for using a pass-through device, according to certain aspects of the present disclosure. Process 1000 can be used with any suitable pass-through device, such as pass-through device 110 of FIG. 1

At block 1002, a barrier having an opening can be provided. Providing the barrier can include providing a barrier without an opening and cutting, stamping, or otherwise creating an opening in the barrier that is suitable for use with the pass-through device (e.g., has a perimeter that is smaller than the main body seal (e.g., seal 662 of FIG. 6). In some cases, providing the barrier further includes creating holes through which fasteners can be inserted to secure the pass-through device to the barrier. The barrier can be a wall of a computer chassis.

At block 1004, the pass-through device can be coupled to the barrier at the barrier opening. Coupling the pass-through device to the barrier can include inserting fasteners through fastener holes in the barrier to engage fastener receivers of the pass-through device. Securing the fasteners can include applying force to the pass-through device to press the main body seal against the barrier.

At block 1006, the door of the pass-through device can be moved to the door open position. Moving the door to the door open position can include releasing (e.g., retracting or disengaging) a latch by actuating an actuator. In some cases, the door can be biased towards the open position such that releasing the latch automatically causes the door to move to the open position, however that need not always be the case. Moving the door to the door open position can automatically cause a second seal segment to move away from a first seal segment, thus establishing a temporary opening defined by the spaced apart first seal segment and second seal segment.

At block 1008, one or more cables can be inserted between the first seal segment and the second seal segment (e.g., through the temporary opening). Inserting one or more cables can include inserting a connector end that is larger than a diameter of the one or more cable openings of the cable seal. Inserting the cables at block 1008 can include inserting the cables to a desired position.

At block 1010, the door can be moved to a door closed position. In some cases, moving the door to the door closed position can include applying force to a front surface of the door to overcome the biasing element and rotate the door into the door closed position. In some cases, such as if a biasing element is not used, moving the door to the door closed position can include releasing a latch or other element holding the door in the door open position. Moving the door to the door closed position can cause the second seal segment to be forced towards and against the first seal segment. In some cases, moving the second seal segment can include applying force on one or more cables to force the one or more cables down one or more inclined surfaces of the first seal segment, and into one or more cable openings. In some cases, when the door is in the door closed position, the door can be automatically latched in place such that the door is secured in the door closed position. In the door closed position, the second seal segment can be forced against the first seal segment such that an airtight seal is formed between the first seal segment, the second seal segment, and the one or more cables therebetween.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the invention. Thus, the breadth and scope of the present invention should not be limited by any of the above described embodiments.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cable pass-through device, comprising:
    a main body couplable to a barrier having a barrier opening, the main body having an opening aligned with the barrier opening;
    an elastomeric first seal segment coupled to the main body at the opening of the main body;
    an elastomeric second seal segment positioned adjacent the first seal segment and movable between an open position and a closed position, the second seal segment spaced apart from the first seal segment in the open position and compressed against the first seal segment in the closed position, wherein the first seal segment and the second seal segment are shaped to receive and compress against a cable therebetween when the second seal segment is in the closed position;
    a door coupled to the main body and the second seal segment, the door movable between a door open position and a door closed position, wherein movement of the door to the door closed position induces the second seal segment to move to the closed position, and wherein movement of the door to the door open position induces the second seal segment to move to the open position;
    a latch for securing the door in the door closed position; and
    an actuator coupled to the latch for releasing the latch.

2. The pass-through device of claim 1, wherein the first seal segment comprises a first cable opening for receiving the cable, and wherein the second seal segment comprises a second cable opening for receiving the cable.

3. The pass-through device of claim 2, wherein at least one seal segment of the first seal segment and the second seal segment comprises compression grooves adjacent the cable opening to facilitate establishing an airtight seal between the seal segment and the cable when the second seal segment is in the closed position.

4. The pass-through device of claim 2, wherein the first seal segment comprises a first angled surface for urging the cable towards the first cable opening.

5. The pass-through device of claim 2, wherein the second seal segment comprises a second angled surface for urging the cable towards the second cable opening.

6. The pass-through device of claim 1, further comprising a door biasing element for biasing the door towards the door open position.

7. The pass-through device of claim 6, wherein the latch comprises a latch body slidably coupled to the main body and movable between a latched position and an unlatched position, wherein the latch does not secure the door when the latch body is in the unlatched position, wherein the pass-through device further comprises a latch biasing element for biasing the latch body towards the latched position, and wherein the actuator is slidable to move the latch body towards the unlatched position.

8. The pass-through device of claim 1, wherein the second seal segment is coupled to a seal base slidably captured within a slot of the main body, and wherein the door is coupled to the seal base through a linkage such that moving the door towards the door closed position induces the seal base to move the second seal segment towards the closed position.

9. The pass-through device of claim 1, wherein the door includes a door seal for sealing a perimeter of the barrier opening when in the door closed position.

10. The pass-through device of claim 1, wherein the barrier is a wall of a computer chassis.

11. A method for passing a cable through a barrier, comprising:
    providing the barrier, the barrier including a barrier opening;
    coupling a pass-through device to the barrier at the barrier opening, the pass-through device comprising:

a main body couplable to the barrier, the main body having an opening aligned with the barrier opening;

an elastomeric first seal segment coupled to the main body at the opening of the main body;

an elastomeric second seal segment positioned adjacent the first seal segment and movable between an open position and a closed position, the second seal segment spaced apart from the first seal segment in the open position and compressed against the first seal segment in the closed position, wherein the first seal segment and the second seal segment are shaped to receive the cable and compress against the cable therebetween when the second seal segment is in the closed position;

a door coupled to the main body and the second seal segment, the door movable between a door open position and a door closed position, wherein movement of the door to the door closed position induces the second seal segment to move to the closed position, and wherein movement of the door to the door open position induces the second seal segment to move to the open position;

a latch for securing the door in the door closed position; and an actuator coupled to the latch for releasing the latch;

actuating the actuator;

moving the door to the door open position in response to actuating the actuator;

inserting the cable between the first seal segment and the second seal segment;

moving the door to the door closed position, wherein moving the door to the door closed position moves the second seal segment into the closed position; and securing the door in the door closed position.

12. The method of claim 11, wherein the first seal segment comprises a first cable opening for receiving the cable, and wherein the second seal segment comprises a second cable opening for receiving the cable.

13. The method of claim 12, wherein at least one seal segment of the first seal segment and the second seal segment comprises compression grooves adjacent the cable opening to facilitate establishing an airtight seal between the seal segment and the cable when the second seal segment is in the closed position.

14. The method of claim 12, wherein the first seal segment comprises a first angled surface for urging the cable towards the first cable opening.

15. The method of claim 12, wherein the second seal segment comprises a second angled surface for urging the cable towards the second cable opening.

16. The method of claim 11, wherein the pass-through device further comprises a door biasing element for biasing the door towards the door open position.

17. The method of claim 16, wherein the latch comprises a latch body slidably coupled to the main body and movable between a latched position and an unlatched position, wherein the latch does not secure the door when the latch body is in the unlatched position, wherein the pass-through device further comprises a latch biasing element for biasing the latch body towards the latched position, and wherein actuating the actuator comprises sliding the actuator to cause the latch body to move to the unlatched position.

18. The method of claim 11, wherein the second seal segment is coupled to a seal base slidably captured within a slot of the main body, wherein the door is coupled to the seal base through a linkage; and wherein moving the door to the door closed position induces the seal base to move the second seal segment towards the closed position.

19. The method of claim 11, wherein the door includes a door seal for sealing a perimeter of the barrier opening when in the door closed position.

20. The method of claim 11, wherein providing the barrier comprises providing a computer chassis having a wall, wherein the barrier is the wall of the computer chassis.

\* \* \* \* \*